United States Patent [19]
Mashiko

[11] Patent Number: 4,961,095
[45] Date of Patent: Oct. 2, 1990

[54] SEMICONDUCTOR MEMORY DEVICE WITH WORD LINES ADJACENT AND NON-INTERSECTING WITH CAPACITOR GROOVES

[75] Inventor: Koichiro Mashiko, Hyogo, Japan
[73] Assignee: Mitsubishi Denki Kabushiki Kaisha, Tokyo, Japan
[21] Appl. No.: 314,242
[22] Filed: Feb. 22, 1989

Related U.S. Application Data
[63] Continuation of Ser. No. 946,915, Dec. 22, 1986, abandoned.

[30] Foreign Application Priority Data
Dec. 25, 1985 [JP] Japan .................................. 60-294125

[51] Int. Cl.[5] ....................... H01L 29/78; H01L 29/06
[52] U.S. Cl. ..................................... 357/23.6; 357/55; 357/51; 365/182; 365/186
[58] Field of Search ........................... 357/23.6, 55, 51; 365/182, 186

[56] References Cited
U.S. PATENT DOCUMENTS

| | | | |
|---|---|---|---|
| 4,586,171 | 4/1986 | Fujishima | 357/23.6 |
| 4,604,639 | 8/1986 | Kinoshita | 357/23.6 |
| 4,606,011 | 8/1986 | Wada | 357/23.6 |
| 4,688,064 | 8/1987 | Ogura et al. | 357/23.6 |

FOREIGN PATENT DOCUMENTS

| | | | |
|---|---|---|---|
| 3222461 | 12/1982 | Fed. Rep. of Germany | 357/23.6 |
| 3525418 | 1/1986 | Fed. Rep. of Germany | 357/23.6 |
| 51-74535 | 6/1976 | Japan | 357/23.6 |

OTHER PUBLICATIONS
1985 IEEE International Solid-State Circuits Conference Digest of Technical Papers (Feb. 15, 1985) pp. 244, 245.

*Primary Examiner*—Jerome Jackson, Jr.
*Attorney, Agent, or Firm*—Lowe, Price, LeBlanc, Becker & Shur

[57] ABSTRACT

A grooved separating region 112 having information electric charge storing capacitances $C_P$ formed on side surfaces thereof is formed to extend the region between the adjacent word line 107 in parallel with the word line 107. As a result, the grooved separating region 112 does not contact the channel region 111 of the gate transistors and does not intersect the word line 107.

11 Claims, 4 Drawing Sheets

SEMICONDUCTOR MEMORY DEVICE WITH WORD LINES ADJACENT AND NON-INTERSECTING WITH CAPACITOR GROOVES

This application is a continuation of application Ser. No. 946,915, filed Dec. 22, 1986.

BACKGROUND OF THE INVENTION

1. Field of the Invention

The present invention relates to a semiconductor memory device and, more specifically, to a semiconductor memory device wherein grooved separating regions are formed between the respective memory cells, with portions of information electric charge storing capacitances of memory cells formed on the side surfaces of the grooved separating regions.

2. Description of the Prior Art

FIGS. 1A and 1B show a memory cell of a dynamic type semiconductor memory device of a large scale integration proposed in Lecture No. FAM17.4 in International Solid State Circuit Conference in 1985 (ISSCC85), wherein FIG. 1B shows a sectional view taken along the line X-X' in FIG. 1A. Referring to the figures, on a P type substrate 1 are layered an $N^+$ type diffusion layer 5, a field oxide film 2, a first polycrystralline silicon layer 3, a second polycrystalline silicon layer 7, a first aluminum wiring layer 6, a second aluminum wiring layer 8, an interlayer insulating film 9 and the like. The first aluminum wiring layer 6 is to become bit lines and is in electrical contact with the $N^+$ type diffusion layer 5 through a contact hole 10. The second polycrystalline silicon layer 7 is to become word lines and is short circuited to the second aluminum wiring layer 8 at predetermined intervals, thereby to decrease the resistance.

It is to be noted that grooved separating regions are formed around the memory cell MC for the purpose of separating the respective memory cells. Use is made of the side surfaces of the grooved separating regions so that an information electric charge storing capacitance $C_p$ may be formed with the first polycrystalline silicon layer 3, the capacitor insulating film 4 (a portion of the field oxide film 2) and $N^+$ type diffusion layer. An information electric charge storing capacitance $C_F$ is also formed in the same structure on the flat portion of the memory cell MC.

The features of the above described conventional structure are that when the chip area is reduced, by decreasing the area of a flat portion having information electric charge storing capacitances $C_F$ formed through active use of the grooved separating portions of the outer peripheral portions of the memory cells MC as information electric charge storing capacitances a sufficiently broad operation margin with sufficient electric charge storing capacitances capable of maintaining ample stored information electric charges for minor carriers injected through radiation such as $\alpha$ particles.

Meanwhile, as shown in FIG. 1A, the longer the length of the memory cell MC, the smaller the depth of the grooves required for providing the same amount of the capacitances $C_F$.

Incidentally described, in situations when the structure of the above described conventional example wherein information electric charge storing regions are formed on grooved separating regions is applied to a folded type bit line structure as shown in Patent Laying-Open No. 74535/1976, the cross sectional structure taken along the line Y-Y' in FIG. 1A becomes as shown in FIG. 2. A semiconductor memory device with such cross sectional structure has the following problems: following.

(1) Since the first polycrystalline silicon layer 3 is patterned in the grooved separating regions is patterning is difficult. The reason is that since the depth of the first polycrystalline silicon layer 3 is changeable in the grooved separating regions, focusing for the purpose of patterning becomes difficult and setting of the etching condition is also difficult.

(2) Since the grooved separating regions are formed on both sides of the channel region of the gate transistor GT which is controlled by the second polycrystalline silicon layer 7 becoming the word line, control of a leak current at the edge (the portion shown by A in FIG. 2) of the channel region of the gate transistor GT is difficult.

(3) Since the second polycrystalline silicon layer 7 becoming the word line extends across the grooved separating regions, an offset of the word line is increased and the patterning becomes difficult while consideration is required in burying grooved separating regions within the insulating film.

SUMMARY OF THE INVENTION

The present invention was made to eliminate the above described problems and aims to provide a dynamic type semiconductor memory device of a large scale integration, having a memory cell structure, wherein ample information electric charge storing capacitances can be secured in spite of large scale integration, etching of the polycrystalline silicon layer in the grooved separating regions is not required, control of a leak current of the gate transistor is facilitated, and an offset of the word line is decreased.

In summary, the present invention is adapted such that memory cells formed at the respective intersections of the word lines and the bit lines are regularly disposed on alternate regions between the word lines, so that grooved separating regions are formed extending in parallel with the word lines between the adjacent memory cells, and a portion of information electric charge storing capacitances of the respective memory cells are formed on the side surfaces of the said grooved separating regions.

According to the present invention, since the grooved separating regions are formed without being in contact with the channel regions of the gate transistors of the respective memory cells and without intersecting the word lines, it is not required to etch the polycrystalline silicon layers becoming the information electric charge storing capacitaces within the grooved separating regions. Furthermore leak current in the channel regions of the gate transistors can be controlled to the degree of an ordinary LOCOS structure, and the offset of the word lines can be also decreased.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a plan view of the memory device, FIG. 3B shows a sectional view taken along the line X-X' in FIG. 3A, and FIG. 3C is a sectional view taken along the line Y-Y' in FIG. 3A.

DESCRIPTION OF THE PREFERRED EMBODIMENTS

Figure 3A:
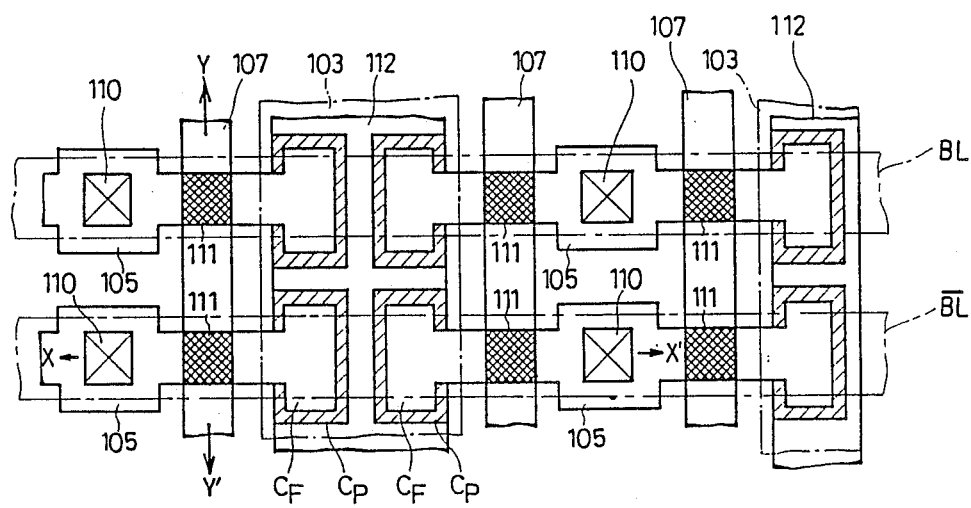
FIGS. 3A, 3B and 3C are views showing a semiconductor memory device in accordance with one embodiment of the present invention. Specifically.
Figure 3B:
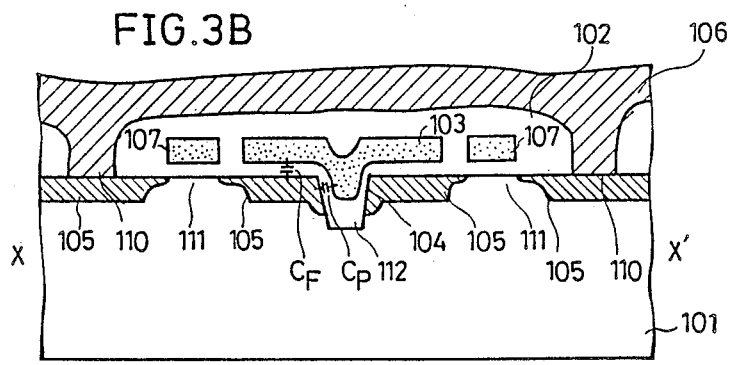
Figure 3C:
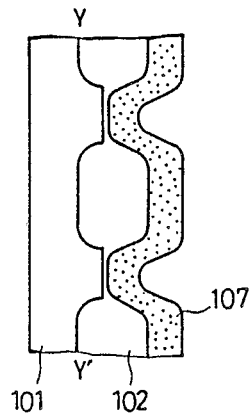

FIGS. 3A, 3B and 3C are views showing a semiconductor memory device in accordance with one embodiment of the present invention. Specifically, FIG. 3A is a plan view of a memory cell portion with the aluminum wiring removed, FIG. 3B shows a sectional view taken along the line X-X' in FIG. 3A, and FIG. 3C is a sectional view taken along the line Y-Y' in FIG. 3A. Referring to the figures, an N$^+$ type diffusion layer 105 is formed in an appropriate region on the surface of a P type silicon substrate 101. On the P type silicon substrate 101, are formed a field oxide film 102, a first polycrystalline silicon layer 103, a first aluminum wiring layer 106, a second polycrystalline silicon layer 107 and the like. A portion of the field oxide film 102 is used as a capacitor insulating film 104 for forming information electric charge storing capacitances. A portion of the N$^+$ type diffussion layer 105 and the first polycrystalline silicon layer 103 are used as an electrode of the information electric charge storing capacitance. The N$^+$ type diffusion layer 105 also becomes source and drain regions of the gate transistor of the respective memory cell. The P type silicon substrate 101 between the N$^+$ type diffusion layer 105 forming the drain region and the N$^+$ type diffusion layer 105 forming the source region constitutes a channel region 111 of the above described gate transistor. The second polycrystalline silicon layer, i.e. the word line 107 is disposed so as to extend above the channel region 111. Accordingly, the gate transistors of the respective memory cells are controlled with the word line 107. The first aluminum wiring layer, i.e. the bit line 106 is disposed so as to intersect the word line 107. The bit line 106 is electrically connected with the N$^+$ type diffusion layer 105 through the contact hole 110.

Meanwhile, the semiconductor memory device of the embodiment shown employs a folded bit line structure. Such folded bit line structure has two adjacent bit lines coupled to a common sense amplifier, not shown. In the following description, one of the bit lines to be paired with respect to the one sense amplifier is denoted with BL, whereas the other bit line is denoted with $\overline{BL}$. The bit lines BL and $\overline{BL}$ to be paired with respect to one sense amplifier are always provided with complementary signals. Then, the potential difference between these bit lines BL and $\overline{BL}$ is amplified by the sense amplifier.

Referring to FIG. 3A, although two upper and lower memory cell columns are shown, the respective contact hole 110 of the memory cells of upper columns are connected to the bit lines BL, for example, whereas the respective contact holes 110 of the memory cells of the lower column are connected to the bit lines $\overline{BL}$, for example. Meanwhile, although FIG. 3A shows a portion of the memory array, it is pointed out that a number of memory cells are disposed in a matrix array portion on the whole memory cell array, so that the respective memory cell columns comes to be connected to any of the bit lines BL and $\overline{BL}$. One contact hole 110 is shared by the two left and right memory cells disposed along the same bit lines 106. It is pointed out that the grooved separating region 112 is formed on the region between the adjacent memory cells which are coupled to the same bit lines. The said grooved separating regions 112 are formed to extend in parallel and linearly with the word line 107. Furthermore, the width of the grooved separating region 112 (the width in the left and right direction in FIG. 3A) is selected to be a width capable of enclosing the three sides of the capacitor portion of the respective memory cell. By utilizing the side surfaces of the grooved separating region 112, the information electric charge storing capacitances $C_P$ are formed with the first polycrystalline silicon layer 103, the capacitor insulating film 104 and the N$^+$ type diffusion layer 105. Information electric charge storing capacitances $C_F$ are also formed with the similar structure by utilizing the the flat portion of the memory cells.

Figure 1A:
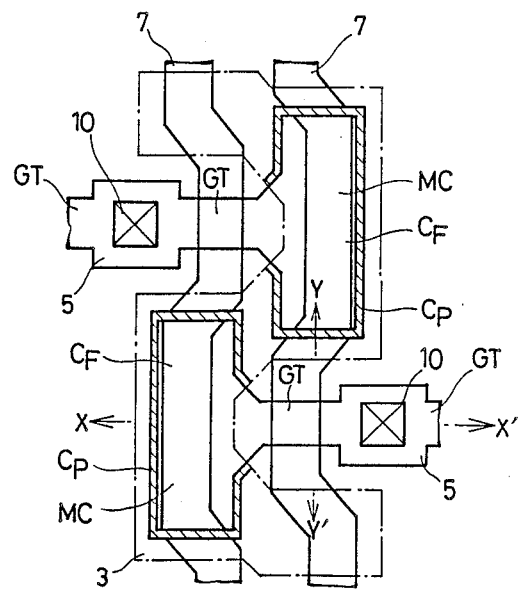
FIGS. 1A and 1B are a plan view and a sectional view of a conventional semiconductor memory device.
Figure 1B:
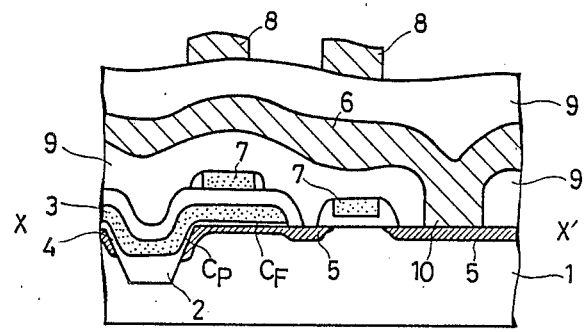

For the purpose of forming the above described grooved separating region 112 in a linear manner, a pattern form of the respective memory cells has been slightly changed as compared with that shown in FIG. 1A. More specifically, in the embodiment shown in FIG. 3A, the memory cells connected to the bit lines BL and the memory cells connected to the bit lines $\overline{BL}$ are disposed in exactly a symmetrical positional relation. In addition, the adjacent memory cells which are coupled to the same bit line 106 are disposed to be opposite with the predetermined intervals. Meanwhile, those having a corresponding positional relation among the memory cells connected to the bit lines BL and the memory cells connected to the bit lines $\overline{BL}$ i.e. those in the same positions in terms of the upper and lower direction in FIG. 3A have the channel regions 111 of the respective gate transistor controlled by the same word lines 107. Accordingly, in case where a given word line 107 is selected, it follows that the information electric charge storing capacitances of the same capacitance values are stored in the bit lines BL and $\overline{BL}$, respectively. Since the bit line pairs BL and $\overline{BL}$ represent one-bit information with a potential difference therein; where the semiconductor memory device of a folded type bit line structure, it follows that in the embodiment shown one-bit is constituted with the two upper and lower memory cells.

Figure 2:
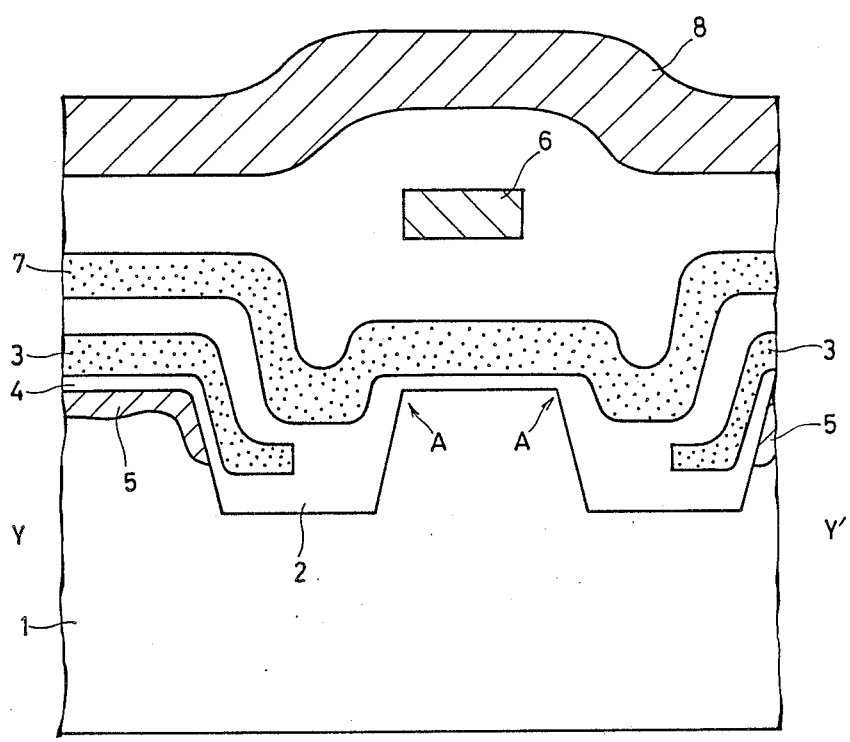
FIG. 2 is a view showing a cross section of a case where the memory structure as shown in FIGS. 1A and 1B is applied to a memory cell of a folded type bit line structure.

As is clear from FIG. 3A, the embodiment shown has the grooved separating region 112 formed along the channel region 111 of the respective gate transistor. Therefore, control of the leak current of the respective gate transistors controlled by the word line 107 is facilitated and the information electric charge retaining property is enhanced. Furthermore, since the first polycrystalline silicon layer 103 one one electrode of the information electric charge storing capacitances, and is formed to cover the grooved separating region 112, necessity of patterning and etching of the first polycrystalline silicon layer 103 within the grooved separating region 112 is eliminated. Therefore, patterning and etching work by the first polycrystalline silicon layer 103 is facilitated as compared with that shown in FIG. 2. Furthermore, the grooved separating region 112 is formed extending in parallel with the word line 107 and without the word line 107 crossing the grooved separating region 112. Therefore, an offset of the second polycrystalline silicon layer forming the word line 107 is reduced and hence the patterning/etching work is facilitated.

The above described embodiment was structured such that storage of one bit is implemented with the two upper and lower memory cells. Such two-cell/one-bit structure brings about the following advantages.

(1) Complementary signals can be always read onto the pair of bit lines BL and $\overline{BL}$, without using dummy memory cells. Accordingly, dummy memory cells can be dispensed with, Furthermore, information errors are prevented due to fluctuation of a reference voltage of the dummy memory cells.

(2) Although some of the conventional semiconductor memory devices are adapted such that information electric charges are read out by precharging the bit lines with the predetermined voltage without employing dummy memory cells, such structure threatens to give rise to information error due to fluctuation of the precharge voltage. By contrast, with the 2-cell/1-bit structure, the read signal voltage difference is read out with the maximum magnitude irrespective of the precharge voltage, with small likelihood of information error.

(3) Noise voltages such as a source voltage fluctuation, a circuit board voltage fluctuation and the like all act equally on both the information electric charge storing capacitances of the memory cells coupled to the bit line BL and the electric charge storing capacitances coupled to the bit line $\overline{BL}$, a shift amount remains the same even if the potential at the bit lines BL and $\overline{BL}$ changes due to the noise voltages, with the result that the potential difference between the bit lines BL and $\overline{BL}$ is always maintained at the same value. Accordingly, damage of the information in the memory cells due to the noise voltages is prevented and an operation margin with respect to any of the information of the high and low level remains unchanged.

(4) Because of the above described advantages (1), (2) and (3), the value of the information electric charge storing capacitances constituting a pair can be made smaller than a half of the information electric charge storing capacitance of one memory cell in the conventional semiconductor memory device and the memory cell array portion can be made small, in case where the same operation margin as that of the conventional semiconductor memory device is to be secured.

As described in the foregoing, a dynamic semiconductor memory device of a large scale integration having increased information electric charge storing capacitances, an increased operation margin and a decreased chip area is provided by forming the grooved separating region 112 so as not to be in contact with the channel region 111 of the respective gate transistors and so as not to intersect the word line 107 and by combining a 2-cell/1-bit structure with a folded type bit line structure.

Figure 4:
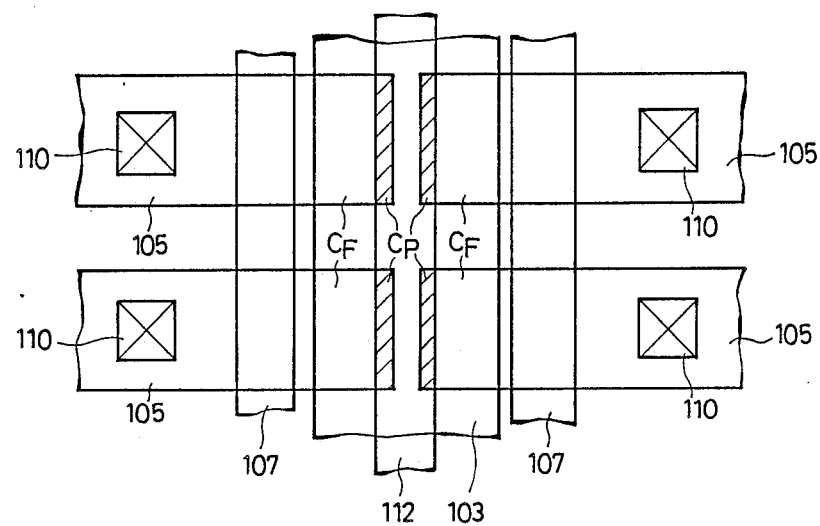
FIG. 4 is a plan view showing another embodiment of the present invention.

Meanwhile, although the above described embodiment is structured such that the chip end portion of the N$^+$ type diffusion layer 105 is broadened in the elongated direction of the word line 107 in order to increase the information electric charge storing capacitances C$_F$ of the flat portion of the respective memory cells, the chip end portion of the N$^+$ type diffusion layer 105 does not necessarily require broadening, as shown in FIG. 4. Although the value of the information electric charge storing capacitances in such case is decreased, the geometry of the memory cells is simplified and the pitches of formation of the respective word line 107 can be decreased, whereby a larger scale integration is made possible.

Although in the above described embodiment the electrodes of the information electric charge storing capacitances were formed with the N$^+$ type diffusion layer 105 and the first polycrystalline silicon layer 103, the electrodes may be formed using other combinations. For example, in case of a combination of the polycrystalline silicon layer and the polycrystalline silicon layer, a memory cell structure being resistive to radio active rays such as alpha rays is provided.

Furthermore, as is clear from FIG. 3B, since the second polycrystalline silicon layer 107 forming the word line and the first polycrystalline silicon layer 103 forming the electrode of the information electric charge storing capacitances are in an overlapping positing polycrystalline silicon layers 103 and 107 can be formed with the same process, simplifing the process and reducing the offset.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate (101), comprising:
   a plurality of word lines (107) disposed in parallel with each other,
   a plurality of bit lines (106) disposed so as to intersect said word lines,
   a plurality of memory cells (C$_F$), (C$_P$) formed at the respective intersections between said word lines and said bit lines and disposed regularly along an elongate direction of said word lines at alternate regions between respective word lines, and
   a grooved separating region (112) formed extending between adjacent memory cells, said grooved separating region being provided only in a non-overlapping relation with said word lines and having a portion of information electric charge storing capacitances of the respective memory cells formed on side surfaces thereof.

2. A semiconductor memory device in accordance with claim 1, wherein said plurality of bit lines comprise folded bit lines including:
   first and second adjacent bit lines;
   a sense amplifier common to said adjacent bit lines, said sense amplifier coupled to said adjacent bit lines;
   said first and second adjacent bit lines provided with first and second complementary signals respectively; whereby the potential signal difference between said adjacent bit lines are amplified by said sense amplifier.

3. A semiconductor memory device in accordance with claim 2, wherein one bit is stored by two memory cells, said memory cells disposed in a symmetrical relation with said elongate direction of said word lines, one of said memory cells coupled to one of said first and second adjacent bit lines and the other of said memory cells coupled to the other of said first and second adjacent bit lines.

4. A semiconductor memory device in accordance with claim 1, wherein said grooved separating region comprises an oxide film formed on the bottom surface thereof.

5. A semiconductor memory device formed on a semiconductor substrate, comprising:
a plurality of word lines disposed parallel to each other;
a plurality of folded bit lines perpendicular to and intersecting said parallel word lines;
a plurality of adjacent memory cells formed at alternate intersections of said bit lines and said word lines, said adjacent memory cells disposed symmetrically relative to said word lines;
a plurality of grooved separating regions comprising an oxide film formed on a bottom surface of grooves forming said separating regions in a non-overlapping relation with said word lines;
said plurality of grooved separating regions formed so as to extend between said alternate adjacent memory cells,
said plurality of grooved separating regions provided only in a region of said substrate parallel to said parallel word lines,
said separating regions having a portion of information electric charge storing capacitance of respective adjacent memory cells formed on side walls of respective separating regions therefor.

6. A semiconductor memory device as recited in claim 5, wherein said semiconductor substrate comprises a first conductivity type material (101), and
further comprising a layer (105) of heavily doped material of a second conductivity type material having a conductivity of a type opposite to said first conductivity type material, formed in predetermined regions on a surface of said semiconductor substrate,
a first polycrystalline silicon layer (103) over a separation region and two of said predetermined regions of second conductivity type materials separated thereby, and
a field oxide film (102) separating said first polycrystalline silicon layer from said predetermined regions of said layer of heavily doped material, from said bit lines, and from said word lines.

7. A semiconductor memory device as recited in claim 6, wherein each of said adjacent memory cell comprises:
a gate transistor having a source and a drain region and
an information electric charge storing capacitance;
said information electric charge storing capacitance comprising a common electrode formed of said first polycrystalline silicon layer, and separate electrodes formed of said predetermined regions of said layer of heavily doped material.

8. A semiconductor memory device as recited in claim 7, wherein said predetermined regions of said layer of heavily doped material form said source and drain regions of said gate transistor.

9. A semiconductor memory device as recited in claim 7, with word lines comprising a second polycrystalline silicon layer (107) over a channel region between said source and drain regions of said gate transistor forming said memory cell.

10. A semiconductor memory device as recited in claim 7, wherein said field oxide film separating said first polycrystalline silicon layer from said predetermined regions of said layer of heavily doped material separates said common electrode formed of said first polycrystalline silicon layer from said separate electrodes formed of said predetermined regions of said layer of heavily doped material, thereby forming a dielectric for said information electric charge storing capacitance.

11. A semiconductor memory device formed on a semiconductor substrate (101), comprising:
a plurality of word lines (107) disposed in parallel with each other,
a plurality of bit lines (106) disposed so as to intersect said word lines,
a plurality of memory cells $(C_F)$, $(C_P)$ formed at the respective intersections between said word lines and said bit lines and disposed regularly along an elongate direction of said word lines at alternate regions between respective word lines, and
a grooved separating region (112) formed extending between adjacent memory cells, said grooved separating region positioned under and located only between sides of a polysilicon layer forming one electrode of an information charge storing capacitance of one of said memory cells, said polysilicon layer formed between and non-overlapping with said word lines, a portion of another electrode of said information charge storing capacitance being formed on a side all of said grooved separating region.

* * * * *